United States Patent [19]

Henderson

[11] 4,149,307

[45] Apr. 17, 1979

[54] PROCESS FOR FABRICATING INSULATED-GATE FIELD-EFFECT TRANSISTORS WITH SELF-ALIGNED CONTACTS

[75] Inventor: Richard C. Henderson, Westlake Village, Calif.

[73] Assignee: Hughes Aircraft Company, Culver City, Calif.

[21] Appl. No.: 865,355

[22] Filed: Dec. 28, 1977

[51] Int. Cl.² .................................... H01L 21/26
[52] U.S. Cl. ...................... 29/571; 148/1.5; 148/187; 156/652
[58] Field of Search ............... 148/1.5, 187; 29/571; 156/652

[56] References Cited

U.S. PATENT DOCUMENTS

| | | | |
|---|---|---|---|
| 3,600,218 | 8/1971 | Pennebaker | 427/38 |
| 3,646,665 | 3/1972 | Kim | 29/571 |
| 3,681,153 | 8/1972 | Clark et al. | 148/187 |
| 3,837,907 | 9/1974 | Berglund et al. | 357/24 X |
| 3,967,981 | 7/1976 | Yamazaki | 148/1.5 |
| 3,972,756 | 8/1976 | Nagase et al. | 148/187 X |
| 4,001,048 | 1/1977 | Meiling et al. | 148/1.5 |
| 4,045,594 | 8/1977 | Maddocks | 156/652 X |
| 4,062,707 | 12/1977 | Mochizuki et al. | 148/187 |
| 4,063,973 | 12/1977 | Kirita et al. | 148/188 |

Primary Examiner—G. Ozaki
Attorney, Agent, or Firm—Mary E. Lachman; W. J. Bethurum; W. H. MacAllister

[57] ABSTRACT

The specification describes a process for making an insulated-gate field-effect transistor wherein a silicon nitride mask is deposited above the surface of a semiconductor body and is used in one embodiment of the invention in conjunction with a refractory gate member (1) as a mask in the formation of the source and drain regions by the ion implantation of conductivity-type-determining impurities on both sides of the gate and (2) as a mask in the formation of contact holes to the source and drain regions of the transistor for the subsequent provision of metal contacts to these regions. In another embodiment, there is described a process for forming source and drain contacts wherein the mask for the formation of contact holes by oxide etching is also the pattern definition and lift-off mask for the formation of metal contacts to the transistor.

8 Claims, 14 Drawing Figures

PROCESS FOR FABRICATING INSULATED-GATE FIELD-EFFECT TRANSISTORS WITH SELF-ALIGNED CONTACTS

FIELD OF THE INVENTION

This invention relates generally to the fabrication of small geometry planar metal oxide semiconductor (MOS) field-effect devices. More particularly, the invention relates to a fabrication process for MOS field-effect devices with insulated gates, in which the alignment of the source and drain regions and their contact areas is significantly improved, and the size of the source and drain regions is minimized, thereby forming devices exhibiting increased speed of performance.

BACKGROUND OF THE INVENTION

In the fabrication of field-effect transistors (FETs) with self-aligned gates, it has been a common practice to use an insulated gate structure in conjunction with the field oxide of a device as the mask for the formation of the source and drain regions thereof. This process allows precise positioning of the source and drain regions of a device with respect to the channel over which the gate electrode exerts its effect and thus avoids undesirable effects such as stray capacitance and ohmic and non-ohmic losses. These self-aligned gate processes have been carried out using both solid state diffusion and ion implantation, as described respectively by H. G. Dill in U.S. Pat. No. 3,544,399 and by R. W. Bower in U.S. Pat. No. 3,472,712, both assigned to the present assignee. After the source and drain regions of a self-aligned gate FET have been established and a surface passivation layer formed thereon, holes are etched in the passivation layer covering these regions using established masking procedures to define and limit the size of the contact holes. Finally, the metal contacts are established using well-known photoresist lift-off techniques which include forming a resist pattern, depositing the metal layer over the resist pattern and then removing the resist pattern to remove portions of the metal layer thereon.

During the prior art formation of the source and drain regions for these insulated-gate FETs, it is customary to use one set of photoresist masking steps to define the lateral extent of these regions. This may be accomplished by using the photoresist mask as an ion-implantation mask per se, or as a means of defining (by etching) the necessary ion implantation mask in another surface material. In either case, in order to properly make the necessary subsequent direct ohmic contacts to these source and drain regions with a chosen metallization pattern and insure that such contacts are sufficiently within the lateral boundaries of these source and drain regions to avoid metallization overlap on the source and drain junctions, it becomes necessary to closely align a second photoresist mask with these previously formed source and drain regions and insure that the etch openings in the second photoresist mask (required for $SiO_2$ removal) are sufficiently within the lateral boundaries of the source and drain regions to prevent PN junction shorting. Since it is known that these mask-to-mask alignment tolerances may cause a variation of as much as 50% in the planar dimensions of the contact area, and since there is a minimum required source and drain silicon surface ohmic contact area corresponding to given current and power requirements of a particular device, these mask-to-mask alignment tolerances impose a limit on the size reduction of devices made by this prior art process. To a large degree, this size reduction limitation establishes or limits the maximum achievable operating or cut-off frequency for these devices. It is the removal of this latter limitation to which the present invention is directed.

SUMMARY OF THE INVENTION

The general purpose of this invention is to provide a new and improved process for fabricating self-aligned gate field-effect transistors in which the required resist mask-to-mask tolerances have been substantially reduced relative to prior art processes while simultaneously minimizing the size of the FET source and drain regions and their respective contact areas in the completed FET devices. It is a more specific purpose of this invention to eliminate a requirement in prior art fabrication processes that an etch opening in a resist mask for metallization pattern definition lie wholly within the lateral boundaries of the FET source and drain regions.

To accomplish these purposes, I have discovered and developed an improved field-effect transistor fabrication process wherein initially a passivation layer is provided on the surface of a semiconductor body. Then, a high temperature-resistant gate electrode member is formed on the surface of the passivation layer and defines one lateral boundary of an active region of a device. Next, a permanent, insulating mask which is etch-resistant and an impurity barrier is formed on the surface of the passivation layer and is spaced from the gate electrode member so as to define another lateral boundary of the above active region of the device. Chosen impurities are then introduced through an exposed area between the gate electrode and the permanent, insulating mask, whereby a doped active device region is formed. Finally, metal contact to the active region is established by first removing a portion of the passivation coating which covers the active device region and then depositing a metallization pattern over a portion of the permanent, insulating mask and into electrical contact with the doped region of the device. Thus, the insulating mask functions (1) as an impurity mask to define the lateral dimension of an active region of the device; (2) as an etch mask during the selective removal of portions of the passivation coating; and (3) as a support for the metallization pattern. In the fabrication of MOS field-effect transistors, two active device regions are formed simultaneously using this process and serve as the source and drain regions of the transistor.

In another embodiment of the invention, during the formation of a metal contact to the active device region or regions, the resist mask which is used for etching the passivation coating to define metal contact openings therein is also used as the mask for the formation and definition of the metal pattern thereof, thus eliminating one masking step required in the previously described embodiment of this invention.

Accordingly, an object of this invention is to provide a new and improved process for fabricating metal oxide semiconductor field-effect devices and integrated circuits having predefined doped active device regions therein.

A further object of this invention is to provide a new and improved process for fabricating high speed, small geometry, refractory metal insulated-gate semiconductor devices and integrated circuits.

Another object is to provide a process of the type described for making MOS devices in which the substrate-to-source and substrate-to-drain capacitance is minimized and the device speed is thereby increased.

Still another object is to provide a fabrication process of the type described which improves the alignment of the source and drain junctions with their respective contact areas, thereby minimizing the size of these junction boundaries and their respective contacts.

A further object of this invention is to provide a fabrication process of the type described which includes the use of the same mask for contact hole formation and for metallization.

The foregoing and other objects and advantages of the invention will be apparent from the following more particular description of the preferred embodiments of the invention, as illustrated in the accompanying drawings.

DESCRIPTION OF THE PREFERRED EMBODIMENT

This invention is concerned with alleviating the problems of mask-to-mask alignment which arise when successive resist patterns must be established in the fabrication of certain MOS semiconductor devices. In the preferred embodiment of this invention, photoresist masks are specifically described. It is to be understood, however, that other resist patterns, such as electron beam, ion beam and x-ray resists, may also be used.

Figure 1B:
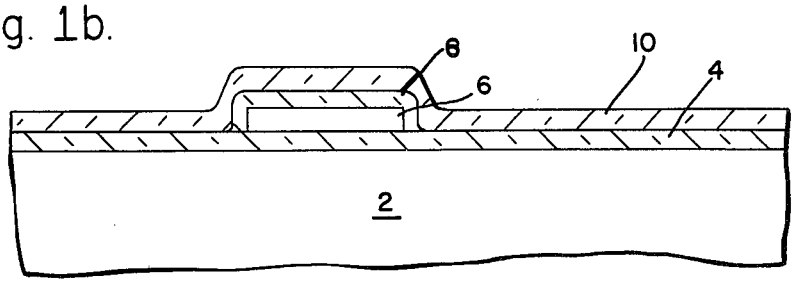
FIGS. 1a through 1j illustrate, in schematic cross-section and in process sequence, the successive fabrication steps utilized in one embodiment of the invention.
Figure 1C:
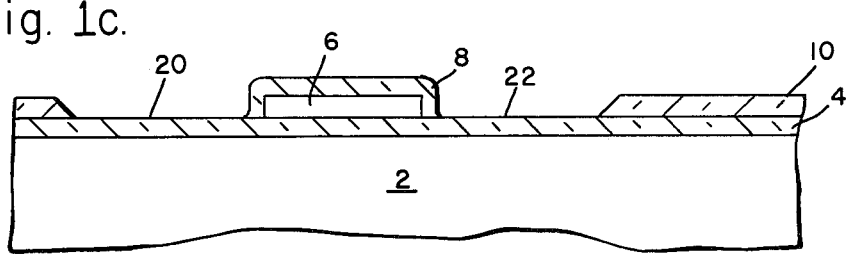
Figure 1D:
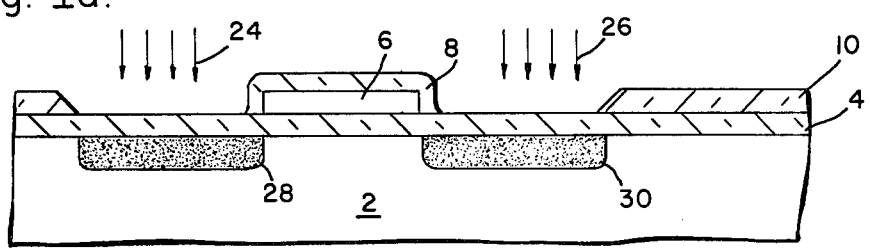
Figure 1A:
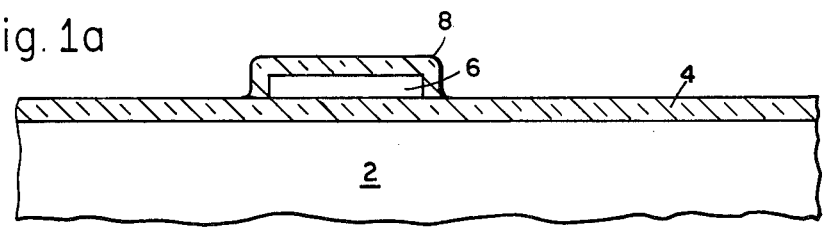

Referring now to FIG. 1a, there is shown a semiconductor body 2 which may be of N-type silicon, for example, having a typical resistivity of 0.1 to 10 ohm-centimeters, and upon which a layer of a surface passivation material 4 has been deposited. A suitable surface passivation material is silicon dioxide, $SiO_2$, which may be formed by heating the silicon semiconductor body 2 in an oxidizing atmosphere, at 1000° C., to produce a layer of $SiO_2$ which is typically 1000 angstroms thick. Next, a high temperature-resistant gate 6, such as a polysilicon gate, typically 1 micron in length, is formed on the surface passivation layer 4, such as by depositing a layer of polycrystalline silicon 3000A thick over the surface passivation layer 4 using standard evaporation at 600° C. or electron beam sputtering techniques and subsequently using known photolithographic masking and etching techniques to selectively remove the silicon and leave the desired gate member in place as shown. Other suitable high temperature-resistant refractory gate materials are tungsten, tantalum, molybdenum, platinum, palladium, or a metal silicide, all of which are capable of withstanding temperatures up to 600° C., and which may be formed by chemical vapor deposition. After the polysilicon gate 6 has been formed, a protective layer 8 of silicon dioxide is formed over the gate 6 by exposure to a suitable oxidizing atmosphere at elevated temperature or by the SILOX process of heating to 380° C. in a mixture of silane and oxygen. If the gate 6 is formed of one of the other high temperature-resistant materials specified herein, the protective layer 8 is formed over the gate 6 by chemical vapor deposition of an oxide layer.

The next step in the process is to deposit an etch-resistant insulating layer 10 over both the passivation layer 4 and the gate-protection insulating layer 8 as shown in FIG. 1b. The layer 10 is an insulating material which is an impurity barrier during ion implantation or diffusion, an etch-resistant protective barrier during silicon dioxide etching and a support for a metallization pattern subsequently deposited thereon. This insulating material may be selected from the group of materials consisting of silicon nitride, aluminum nitride, aluminum oxide, silicon carbide, titanium oxide, and boron nitride. Preferably, the layer 10 is silicon nitride ($Si_3N_4$), and is between 0.2 to 1.0 micron in thickness, which is a sufficient thickness to provide an impurity barrier during ion implantation. The silicon nitride layer 10 may be deposited by heating a dilute (for example, 5%) mixture of silane in nitrogen, with ammonia to 925° C., to vapor deposit $Si_3N_4$. Then portions of the $Si_3N_4$ layer 10 are etched away in the regions 20 and 22 and the region between regions 20 and 22 which overlies gate-protection layer 8, as indicated in FIG. 1c, to define the lateral boundaries of the source and drain regions and to expose the gate member with its protection layer 8. Typically, an electron beam resist (not shown) such as polymethylmethacrylate may be deposited on the $Si_3N_4$ layer 10 and then developed in a 1:3 solution of 2-propanol and methylisobutylketone to form the desired resist pattern. Then, etching is performed using a suitable etchant, e.g., a phosphoric acid solution, that is preferential for $Si_3N_4$. Etching may also be performed using carbon tetrafluoride ($CF_4$) gas and plasma etching techniques well-known in the art.

After the $Si_3N_4$ has been removed from regions 20 and 22, the structure of FIG. 1c is subjected to an ion implantation or diffusion step to introduce chosen P-type impurities into the silicon substrate 2, thereby producing active device regions to be described. (If a P-type substrate is used, then N-type impurities are introduced by ion implantation or diffusion.) For convenience, this discussion considers the details of ion implantation. It is to be understood, however, that well-known diffusion processes can also be used. With the structure of FIG. 1c transferred to an ion implantation chamber, P-type ion beams 24 and 26 of FIG. 1d are suitably focused on the exposed areas of the $SiO_2$ layer 4 covering the silicon layer 2 to modify the impurity concentration in regions 28 and 30 and form the planar PN junctions indicated in FIG. 1d. The active device regions, which in this embodiment of the invention are source and drain regions 28 and 30, thus formed are self-aligned both to the gate member 6 and to the edges of the insulating (silicon nitride) layer 10, as indicated in FIG. 1d.

Ion implantation processes, which are well known in the art, involve ionizing impurity atoms such as boron and phosphorus and then accelerating these ions by an electric field into the crystal lattice of the exposed semiconductor substrate. In this particular instance, a typical ion dose of $5 \times 10^{14}$ ions/cm$^2$ at 30–40 KeV is used to implant to a depth of less than 0.5 microns. The $SiO_2$ layer 4 covering the substrate in the path of the ion beams is sufficiently thin to allow the ion beams to pass through to the underlying silicon substrate 2. After implantation, the device is annealed by heating to a suitable elevated temperature such as 950° C., to electrically activate the implanted regions. The source and drain region 28 and 30 thus formed have typical lateral dimensions of 1 micron by 2 microns and typical resistivities of 0.001 ohm-centimeter.

Figure 1F:
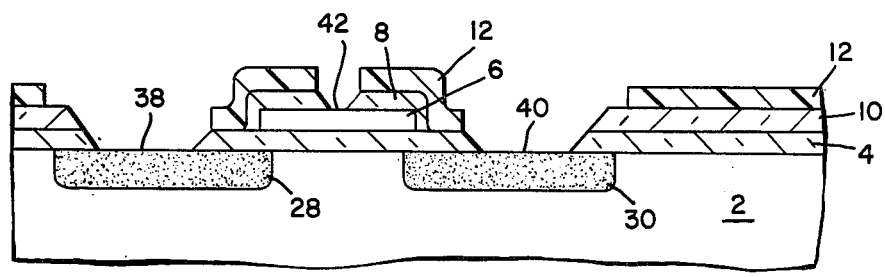
Figure 1G:
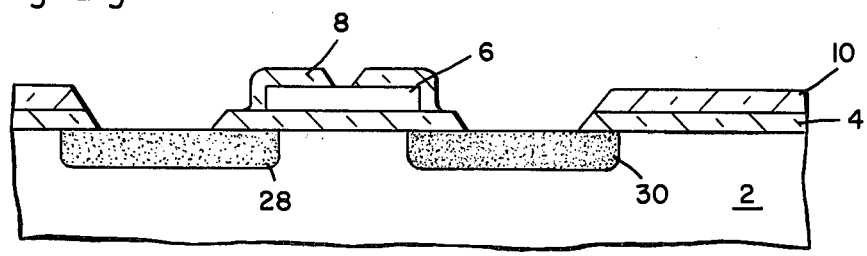
Figure 1E:
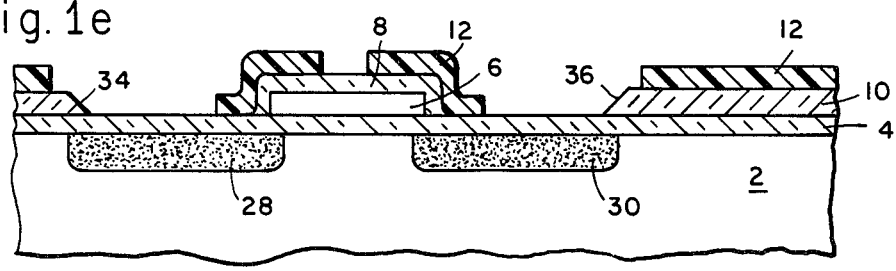

After ion implantation has been completed, contact holes are etched and metal contacts are established as shown in FIGS. 1e through 1j. The first step in this portion of the process is to apply a photoresist material 12 which is suitable for oxide etching and, using standard photolithographic processing, to establish the desired photoresist mask as shown in FIG. 1e. It should be noted that the alignment of the photoresist mask with the nitride edges 34 and 36 of FIG. 1e is not critical when practicing this invention, since the nitride layer 10 that has previously been established will also mask the oxide etchant. This feature is of utmost significance in that mask-to-mask alignment tolerances now require that only the central gate-contact portion of the photoresist mask 12 be aligned as shown to expose a central region of the thin oxide layer 8; and the precise location at which the peripheral portions of the photoresist layer 12 meet the underlying $Si_3N_4$ layer is not critical. Next, portions of the $SiO_2$ layers 4 and 8 are etched away in the regions 38, 40 and 42 as shown in FIG. 1f, thus exposing the active device regions 28 and 30 and the polysilicon gate 6. An oxide etchant such as dilute hydrofluoric acid, HF, which is selective for $SiO_2$ and does not significantly affect the $Si_3N_4$ is used, and consequently the size of the source and drain contact holes 38 and 40 is limited by the $Si_3N_4$ mask as well as by the photoresist mask. Since the contact holes are aligned to the same nitride edges as the source and drain regions, these regions can now be originally made much smaller than would have been the case if an opening is a subsequently used photoresist mask provided total lateral definition for the source and drain ohmic contact openings.

Since the capacitance between the source or drain region and the substrate is directly proportional to the area of junction between the two, the reduced PN junction area made possible by the present invention minimizes this capacitance, which is typically $10^4$ picofarads/cm$^2$, and makes circuits of higher speed possible. Furthermore, the reduced ohmic contact area permits a greater packing density, which in turn allows a higher level of integration in a given area. In addition, the procedure can tolerate some misalignment of the resist window used for defining the electrical contacts without affecting the size of the source and drain areas. After the etching procedure illustrated in FIG. 1f has been completed, the photoresist layer 12 is then removed to yield the structure shown in FIG. 1g.

Figure 1I:
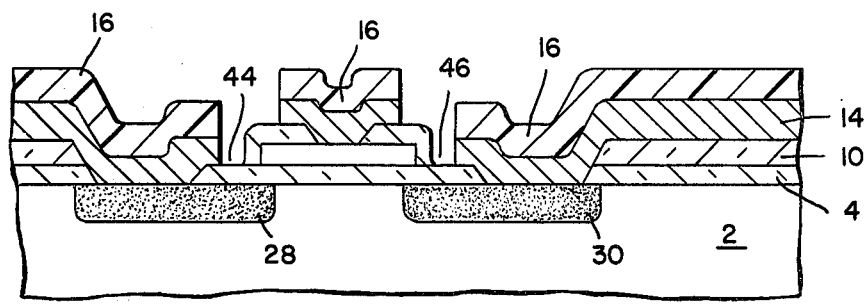
Figure 1J:
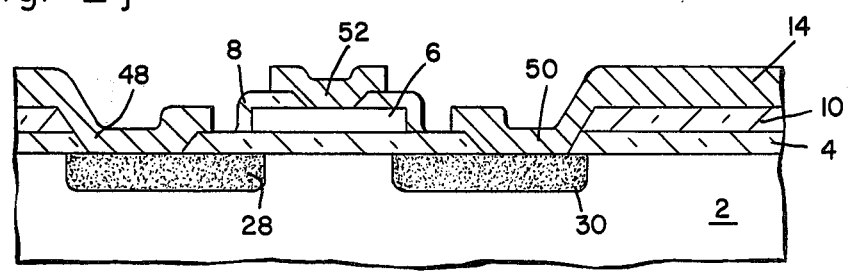
Figure 1H:
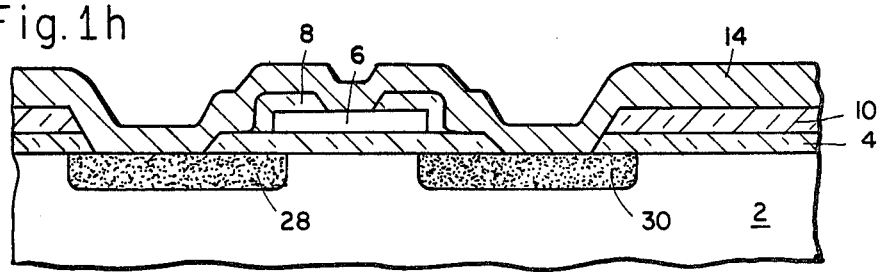

The next step in the process is to deposit a layer 14 of metal, such as aluminum, using conventional aluminum evaporation techniques in order to provide the structure shown in FIG. 1h. Other suitable materials for metallization in this step are tungsten, molybdenum, titanium-platinum-gold multilayer, and titanium-palladium-gold multilayer. Then, a photoresist material which is suitable for metal etching is applied on top of the metal layer 14 and the desired photoresist mask 16 is established therein as shown in FIG. 1i. Next, the metal layer 14 is etched away in the regions 44 and 46 overlying outer portions of the gate insulator 4 as shown in FIG. 1i. The photoresist layer 16 is then removed by conventional methods to produce the structure of FIG. 1j, which includes metal contacts 48, 50 and 52 to the active device source and drain regions 28 and 30 and the polysilicon gate 6, respectively. The metal contacts 48 and 50 to the active device source and drain regions 28 and 30 have typical lateral dimensions of 1 micron by 1 micron.

Referring now to FIG. 2, a second embodiment of the invention is shown which differs from that in FIG. 1 in the sequence followed for contact hole formation and metallization, with the elimination of one masking step relative to the number of steps used in FIG. 1. FIG. 2a shows a structure which is obtained in the same manner as that produced by the process described for FIGS. 1a through 1e; that is, the silicon nitride mask has been formed, ion implantation has been performed and the photoresist material 12' which is suitable both for oxide etching and for metallization pattern definition has been applied and developed to form the desired surface resist mask 2'. Next, portions of the $SiO_2$ layers 4' and 8' are etched away in regions 38', 40' and 42' as shown in FIG. 2b and in a manner similar to that described above for FIG. 1f. After the contact holes 38', 40' and 42' have been etched and with the photoresist 12' still in place, a layer 14' of metal, such as aluminum, is deposited on the upper surface of the photoresist layer 12' using conventional aluminum evaporation techniques, thereby providing the structure shown in FIG. 2c. Thus, in this embodiment of the invention, the same photoresist mask 12' is used both for oxide etching to form contact holes and for establishing the metal pattern that connects the source, drain and gate structures, thereby eliminating one masking step and the associated mask-to-mask alignment problems. Thus, this embodiment of the invention serves to further minimize the size of the metal contacts to the active device regions. The use of the insulating layer 10' is essential to both process embodiments of the invention. Without this etch-resistant insulating layer 10', the oxide overlying the non-implanted silicon substrate would also be etched when contact holes are formed and could provide undesirable exposure of the underlying substrate and when metal is subsequently deposited, the PN junctions defining source and drain regions could be shorted, rendering the device inoperable.

Figure 2B:
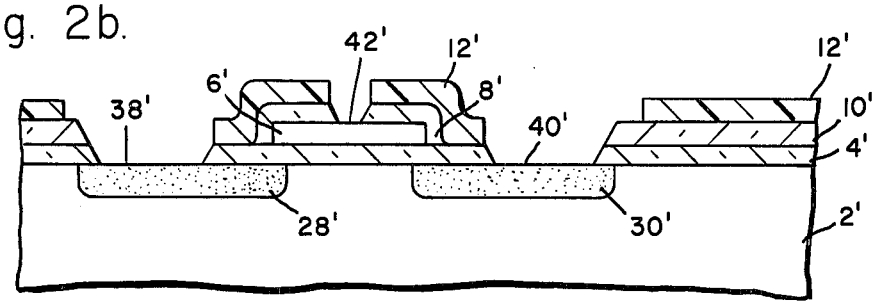
FIGS. 2a through 2d illustrate in schematic cross-section and in process sequence, the fabrication steps utilized in another embodiment of the invention.
Figure 2C:
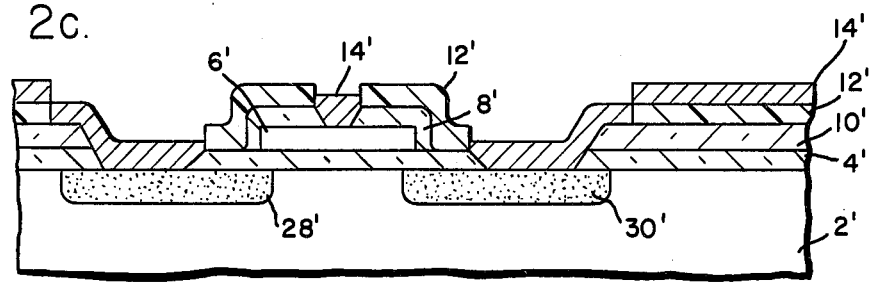
Figure 2D:
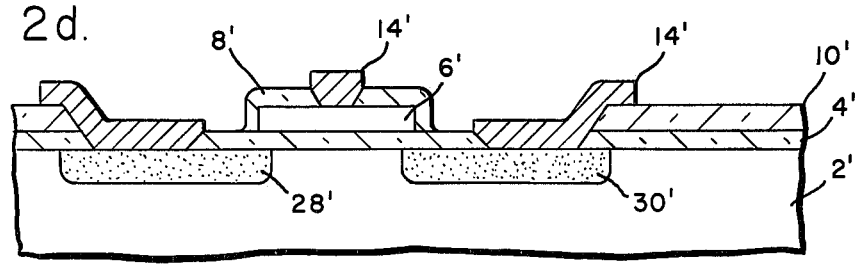
Figure 2A:
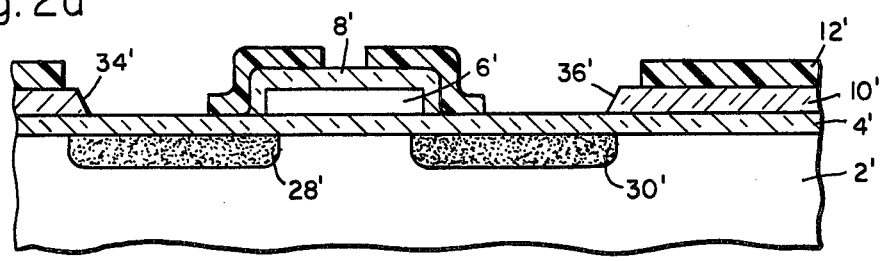

Finally, the photoresist layer 12' is lifted off using conventional resist lift-off techniques to yield the final structure shown in FIG. 2d, which provides metal contacts to the active device regions 28' and 30' and to the polysilicon gate 6'.

While the invention has been particularly described with respect to the preferred embodiments thereof, it will be recognized by those skilled in the art that certain modifications in form and detail may be made without departing from the spirit and scope of the invention. In particular, the scope of this invention is not limited to the insulated gate field-effect transistors described, but includes charge transfer devices, such as charge-coupled devices, and other devices which utilize a self-aligned insulated gate to modify the flow of information on each side of that gate. In addition, although the preferred embodiments of this invention which are described indicate that ions are implanted through a passivation layer which covers the areas where the active device regions are to be formed, this invention applies as well to processes in which ions are implanted through a mask directly into the areas where the active device regions are to be formed. It should be further understood that while the fabrication of a single device is described, in practice a large number of identical devices may be simultaneously formed on a common semiconductor body, to form integrated circuits.

What is claimed is:

1. A process for fabricating metal oxide semiconductor (MOS) field-effect devices having predefined doped active device regions, including:
    (a) providing a surface passivation layer on the surface of a semiconductor body,
    (b) forming a high temperature-resistant gate electrode member on the surface of said passivation layer to define one lateral boundary of an active device region,
    (c) forming a permanent insulating, etch-resistant and impurity barrier mask on the surface of said passivation layer and spaced from said gate electrode member to define another lateral boundary of said active device region,
    (d) introducing chosen impurities through exposed areas of both sides of said gate electrode member and defined by edges of said gate electrode member and edges of said etch-resistant and impurity barrier mask and into said semiconductor body to form said doped active device regions,
    (e) removing a portion of said passivation coating which lies over each of said doped regions, and
    (f) depositing a metallization pattern over a portion of said insulating mask and into electrical contact with said doped regions, whereby said insulating mask serves as an impurity mask to define the lateral dimension of said doped region, as an etch protection mask during the selective removal of portions of said passivation coating, and as a support for said metallization pattern.

2. The process of claim 1 wherein steps (e) and (f) are combined by using the same resist mask for removing a portion of said passivation coating and for depositing said metallization pattern.

3. The process of claim 1 wherein said permanent insulating, etch-resistant and impurity barrier mask is selected from the group of materials consisting of silicon nitride, aluminum nitride, aluminum oxide, silicon carbide, titanium oxide, and boron nitride.

4. The process of claim 1 which includes vapor depositing said insulating, etch-resistant and impurity barrier as a layer of silicon nitride having a thickness between 0.2 to 1.0 micrometers.

5. The process of claim 1 wherein said high temperature-resistant gate electrode is selected from the group of materials consisting of polysilicon, tungsten, tantalum, molybdenum, platinum, and palladium.

6. A process for fabricating an insulated-gate field-effect device comprising the steps of:
    (a) providing a surface passivation layer on the surface of a silicon semiconductor body;
    (b) forming a high temperature-resistant gate electrode member on a portion of said passivation layer and forming a gate-protection insulating layer over said gate electrode member;
    (c) depositing a layer of an insulating etch-resistant, impurity barrier material over the surface of said passivation layer and said gate-protection insulating layer;
    (d) opening holes in said layer of insulating etch-resistant, impurity barrier material;
    (e) introducing conductivity-type-determining impurity ions into the surface of said semiconductor body and through areas thereon unmasked by said gate electrode member and by said impurity barrier material to form ion implanted regions of like conductivity type in said semiconductor body adjacent the region thereof under said refractory gate electrode member, said ion implanted regions forming the source and drain regions of said field-effect device;
    (f) forming a photoresist pattern having openings over said gate electrode member, over said regions of like conductivity type and said passivation layer thereon, and also over the remaining portion of said insulating material;
    (g) opening holes in the portions of said passivation layer which are exposed by said openings in step (f) and which lie over portions of said regions of like conductivity type and also opening a hole in a portion of said gate-protection layer which is exposed by said opening in step (f) and which lies over said gate member; and
    (h) providing electrical connections to said regions of like conductivity type through said holes in said passivation layer and to said gate electrode member through said hole in said gate-protection layer.

7. The process of claim 6, wherein step (h) includes depositing metal directly over said photoresist pattern of step (f) and then lifting off said photoresist.

8. In a process for fabricating a self-aligned gate field-effect transistor wherein a semiconductor body is provided with a surface passivation layer and a gate electrode thereon which serves as part of an impurity mask for defining and limiting one lateral dimension of source and drain regions in said body, the improvement comprising: forming an insulating etch-resistant and impurity barrier mask on said surface passivation layer and having one edge portion coextensive and aligned with another lateral dimension of said source and drain regions of said transistor, using said insulating mask to provide part of an impurity mask for said source and drain regions, then part of an etch mask for said passivation layer to expose said source and drain regions for electrical contacts, and finally as a means for supporting a metallization pattern extending thereover and into electrical contact with said source and drain regions, to provide self-aligned electrical contact openings within the lateral boundaries of said source and drain regions of said transistor.

* * * * *

UNITED STATES PATENT AND TRADEMARK OFFICE
CERTIFICATE OF CORRECTION

PATENT NO. : 4,149,307
DATED : April 17, 1979
INVENTOR(S) : RICHARD C. HENDERSON It is certified that error appears in the above—identified patent and that said Letters Patent is hereby corrected as shown below:

In the drawings, sheet 4, FIG. 2c, the layer 14' should overlay the entirety of the layer 12', including the portion thereof above the layer 8', as shown in the corrected drawing below:

FIG. 2c

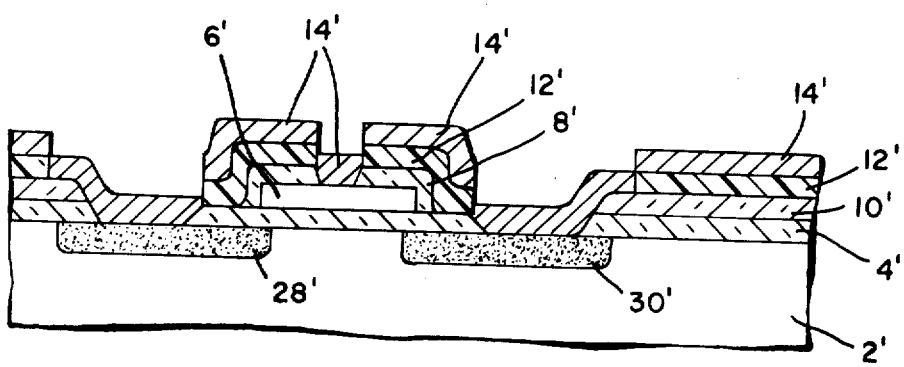

Signed and Sealed this

Twenty-ninth Day of July 1980

[SEAL]

Attest:

SIDNEY A. DIAMOND

Attesting Officer

Commissioner of Patents and Trademarks